United States Patent
Narita

(10) Patent No.: US 7,732,338 B2
(45) Date of Patent: Jun. 8, 2010

(54) METHOD OF FABRICATING SEMICONDUCTOR DEVICE WITH REDUCED PITCH

(75) Inventor: Masaki Narita, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/251,791

(22) Filed: Oct. 15, 2008

(65) Prior Publication Data

US 2009/0104786 A1    Apr. 23, 2009

(30) Foreign Application Priority Data

Oct. 17, 2007    (JP) .............................. 2007-270259

(51) Int. Cl.
*H01L 21/311* (2006.01)

(52) U.S. Cl. ...................... 438/702; 438/700; 438/734; 438/763; 257/E21.24

(58) Field of Classification Search ................. 438/702; 257/E21.24
See application file for complete search history.

(56) References Cited

U.S. PATENT DOCUMENTS 6,638,441 B2 * 10/2003 Chang et al. .................. 216/46
7,312,158 B2    12/2007 Miyagawa et al.
2002/0076495 A1 *   6/2002 Maloney et al. .............. 427/272
2002/0179962 A1 * 12/2002 Kinoshita .................... 257/315
2007/0059914 A1     3/2007 Jung et al.
2007/0202705 A1     8/2007 Kim et al.

FOREIGN PATENT DOCUMENTS

JP    2006-32648    2/2006

* cited by examiner

*Primary Examiner*—Thao X Le
*Assistant Examiner*—Ajay K Arora
(74) *Attorney, Agent, or Firm*—Oblon, Spivak, McClelland, Maier & Neustadt, L.L.P.

(57) ABSTRACT

A method of fabricating a semiconductor device includes depositing a first film on a workpiece film so that a resist is formed on the first film, processing the first film with the resist serving as a mask, depositing a second film along the first film, processing the second film so that the second film is left only on a sidewall of the first film, depositing a third film on the substrate, exposing a sidewall of the second film, depositing a fourth film along the sidewall and an upper surface of the third film, removing the fourth film except for only its part on the sidewall of the second film, depositing a fifth film on the substrate, planarizing the second to fifth films so that the upper surfaces of the films are exposed, and processing the workpiece film while the second and fifth films serve as a mask.

8 Claims, 7 Drawing Sheets

METHOD OF FABRICATING SEMICONDUCTOR DEVICE WITH REDUCED PITCH

CROSS-REFERENCE TO RELATED APPLICATIONS

This application is based on and claims the benefit of priority from the prior Japanese Patent Application No. 2007-270259, filed on Oct. 17, 2007, the entire contents of which are incorporated herein by reference.

BACKGROUND OF THE INVENTION

1. Field of the Invention

The present invention relates to a method of forming a line-and-space pattern with a microscopic pitch, and more particularly to a method of fabricating a semiconductor device, suitable for the forming of a shallow trench isolation (STI) structure, gate electrodes or wiring patterns.

2. Description of the Related Art

Forming a wiring pattern of line-and-space includes a first pattern forming method by processing a wiring material film and a second pattern forming method by burying a wiring material in grooves of a wiring pattern formed on an insulating film. In the first pattern forming method, a mask is normally formed which has the same pattern as a wiring pattern of line-and-space that is resolvable by an exposure technique. A base film which is a conductive film is formed into a desired wiring pattern using the mask. In the second pattern forming method, a mask is normally formed which has the same pattern as a wiring pattern of line and space that is resolvable by an exposure technique. A base film which is an insulating film is patterned using the mask, whereby grooves are formed. A wiring material is buried in the formed grooves and thereafter, unnecessary wiring material is removed by a chemical and mechanical polishing (CMP) process, whereby a desired wiring pattern is obtained.

A pitch of obtained line-and-space patterns depends upon the resolution limit of the exposure technique in each of the above-described pattern forming methods. With recent acceleration of refinement, however, it has become more and more difficult to refine the pitch by the exposure technique. On the other hand, various methods have recently been suggested for forming a line-and-space pattern having a pitch exceeding the resolution limit of the exposure technique. For example, Japanese patent application publication, JP-A-2006-32648 and U.S. Pat. No. 7,312,158 propose a pattern forming method called "sidewall mask transfer method." In this method, mask films formed on sidewalls of a first pattern are left thereby to be used as a second pattern. This method can form a line-and-space pattern whose pitch is one-half of a pitch in the exposure technique. However, the aforesaid reduction of the pitch by the exposure technique is insufficient for miniaturization, and a further pitch reduction is necessitated.

BRIEF SUMMARY OF THE INVENTION

According to one aspect of the present invention, there is provided a method of fabricating a semiconductor device, comprising depositing a desired workpiece film above a semiconductor substrate and further depositing a first film on the workpiece film so that a resist is formed above the first film, the resist being patterned into a line-and-space pattern with a predetermined pitch, processing the first film with the resist serving as a mask, removing the resist and thereafter, depositing a second film along a surface of the processed first film, the second film having a film thickness that is one third of the predetermined pitch, and processing the second film so that upper surfaces of the first film and the workpiece are exposed and so that the second film is left on a sidewall of the first film, depositing a third film on the exposed workpiece, the exposed first film and the second film, planarizing the third film so that the upper surface of the first film is exposed, removing the first film exposed by the planarizing process so that the sidewall of the second film is exposed, depositing a fourth film along the sidewall of the exposed second film and an upper surface of the planarized third film, the fourth film having a film thickness that is one third of the predetermined pitch, removing the fourth film formed on the upper surfaces of the planarized third film and the workpiece so that the upper surfaces of planarized third film and the workpiece are exposed and the fourth film is left on the sidewall of the second film, depositing a fifth film on the exposed upper surfaces of the planarized third film and the workpiece and the fourth film, planarizing the fifth, second, third and fourth films so that the upper surfaces of the second, third, fourth and fifth films are exposed, removing the exposed third and fourth films, and processing the workpiece film while the second and fifth films left as the result of removal of the third and fourth films serve as a mask, wherein the workpiece film comprises a silicon oxide film, the third film comprises a silicon nitride film, the first and fourth films each comprise one and the same type of film having selectivity with the workpiece film and the third film, and the second and fifth films each comprise one and the same type of film having selectivity with the third and first films.

DETAILED DESCRIPTION OF THE INVENTION

Figure 1:
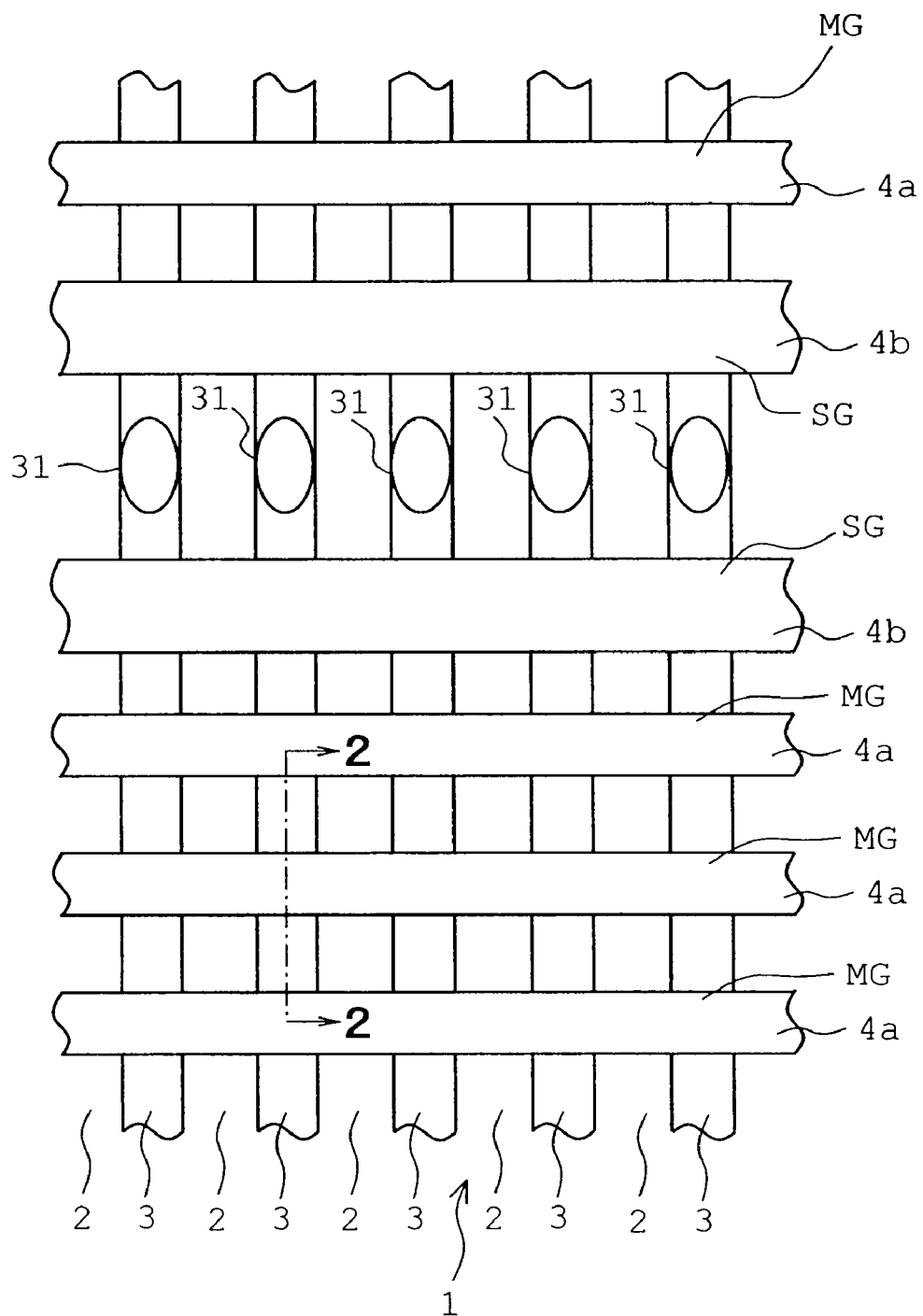
FIG. 1 is a schematic plan view showing a layout pattern of gate electrodes and shallow trench isolation (STI) structure employed in a semiconductor device of a first embodiment in accordance with the present invention.

A first embodiment of the present invention will be described with reference to FIGS. 1 to 6 of the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratio and the like differ from respective natural dimensions.

Referring to FIG. 1, a memory cell region of the NAND flash memory is schematically shown. A silicon substrate 1 serving as a semiconductor substrate has a memory cell region in which strip-shaped active regions 3 serving as element forming regions are defined by shallow trench isolation (STI) trenches 2. Each STI trench 2 is formed by burying an insulating film in each of trenches formed at predetermined intervals in the substrate 1 as will be described later. Word lines 4a of memory cell transistors and selective gate lines 4b of selective gate transistors are arranged on an upper surface of the substrate 1 so as to be perpendicular to the STI trenches 2. The selective gate lines 4b are disposed so that spaces between the adjacent selective gate lines 4b are larger than spaces between the adjacent word lines 4a. Gate electrodes MG are formed on portions of the substrate 1 in regions where the word lines 4a and the active region 3 intersect each other, respectively. Furthermore, gate electrodes SG are formed on portions of the substrate 1 in regions where the word lines 4a and the active region 3 intersect each other, respectively. Additionally, bit line contacts 31 are formed on active regions 3 between the selective gate lines 4b.

Figure 2:
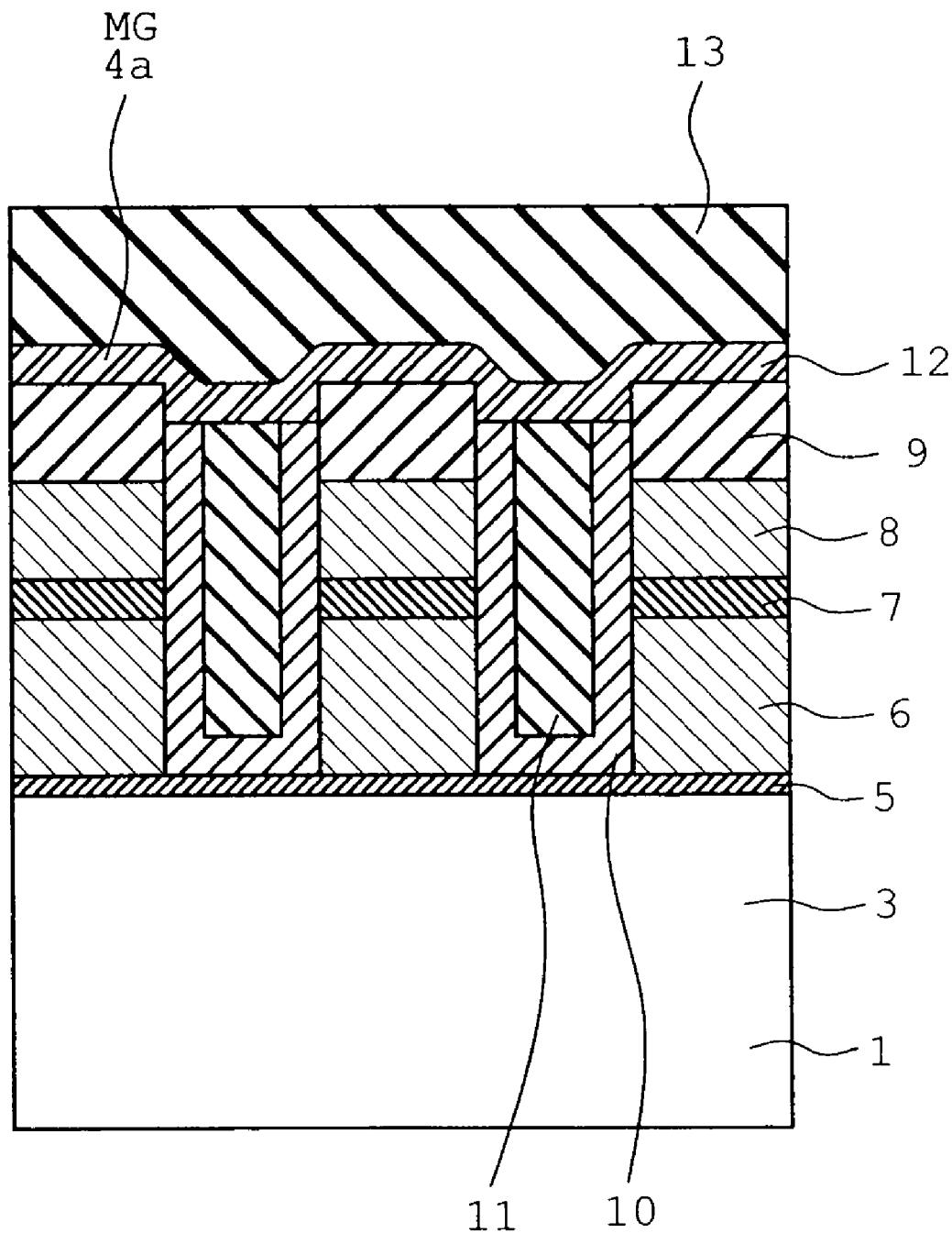
FIG. 2 is a schematic sectional view of a memory cell transistor.

FIG. 2 shows a sectional view taken along line 2-2 in FIG. 1 or more specifically, a section along the active region 3 in FIG. 1. A gate oxide film 5 serving as a gate insulating film is formed on upper surfaces of the active regions 3 which are isolated by the STI trenches 2. The gate electrodes MG are formed at predetermined intervals on the gate oxide film 5. Each gate electrode MG comprises a lowest polycrystalline silicon film 6 serving as a first conductor film, an oxide-nitride-oxide (ONO) film 7 serving as an intergate insulating film, a polycrystalline silicon film 8 serving as a second conductor film and a cobalt silicide (CoSi) film 9 serving as a silicide layer formed by silicifying an upper part of the polycrystalline silicon film 8. The polycrystalline silicon film 6 functions as a floating gate electrode, whereas the polycrystalline silicon film 8 and the CoSi film 9 function as a control gate electrode. The aforesaid intergate insulating film may be a high-dielectric constant film with an alumina layer. Additionally, the silicide layer may be a nickel or a tungsten layer.

A high temperature oxide (HTO) film 10 is formed by a low pressure chemical vapor deposition (LPCVD) process on opposed sidewalls of each gate electrode MG and a part of the substrate 1 located between the adjacent gate electrodes MG with the gate oxide film 5 being interposed therebetween. The HTO film 10 serves as a second insulating film. A tetraethyl orthosilicate (TEOS) film 11 serving as a first interlayer insulating film is buried inside the HTO films of the adjacent gate electrodes MG. Each TEOS film 11 has an upper surface which is located substantially at the same level as the height of the gate electrode MG relative to the substrate 1.

A silicon nitride film 12 serving as a barrier film is formed over upper surfaces of the gate electrodes MG and the TEOS films 11. A d-TEOS film 13 serving as a third interlayer insulating film is formed on the silicon nitride film 12. The TEOS film 11 buried between the adjacent gate electrodes MG has an upper end located near upper ends of the gate electrodes MG. Accordingly, the silicon nitride film 12 is formed without entering into a lower part of the gate electrode MG.

Figure 3:
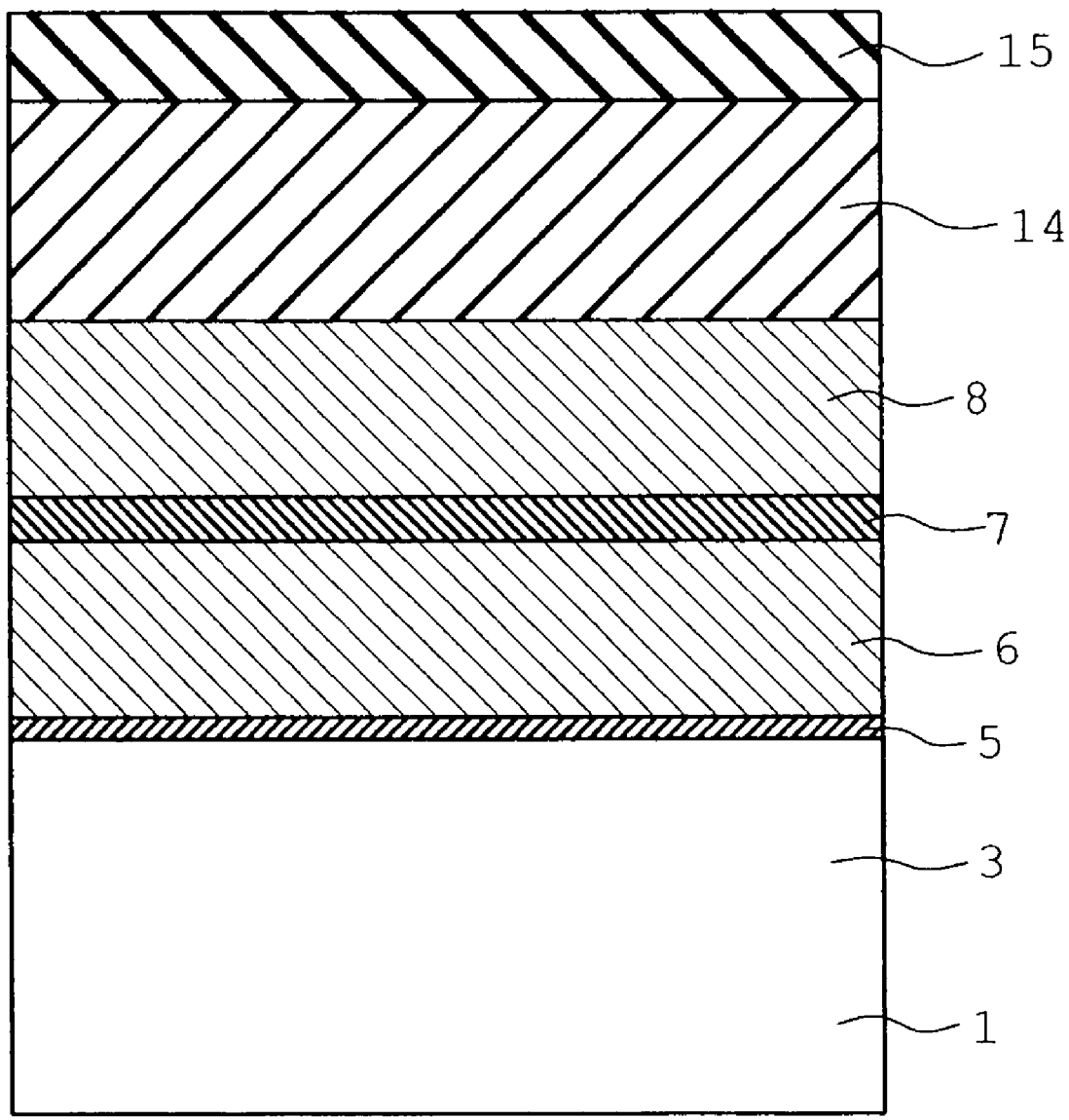
FIGS. 3 to 14 are schematic sectional views of the semiconductor device at respective stages of fabricating process (Nos. 1 to 12)

The following describes a fabricating process of the foregoing gate electrodes MG or more specifically, a fabricating process of line-and-space pattern (having a pitch smaller than the resolution limit of the exposure technique) for the forming of gate electrodes. Firstly, the gate oxide film 5 is formed on the silicon substrate 1 serving as the semiconductor substrate using a thermal oxidation technique as shown in FIG. 3. A p-doped polycrystalline silicon film 6 is then deposited by a low pressure chemical vapor deposition (LPCVD) process. Furthermore, the ONO film 7 serving as an intergate insulating film is formed. The ONO film 7 is an interpoly insulating film comprising a layer stack of $SiO_2$—$SiN$—$SiO_2$. A phosphorous-doped polycrystalline silicon film 8 for control gate electrodes is formed on the ONO film 7.

Subsequently, the silicon nitride film 14 is formed and the silicon oxide film 15 serving as the processed film is deposited on the silicon nitride film 14. A boro-silicate glass (BSG) film or boron-doped silicon oxide film 16 serving as a first film is deposited on the silicon oxide film 15. Subsequently, a photoresist film is patterned using a lithography technique thereby to be formed into a resist 17 of a line-and-space pattern with a predetermined pitch (in which a line width and an interline space are equal to each other). An antireflection film 18 is formed on the BSG film 16 in order that a resolution of the resist 17 may be improved.

Figure 5:
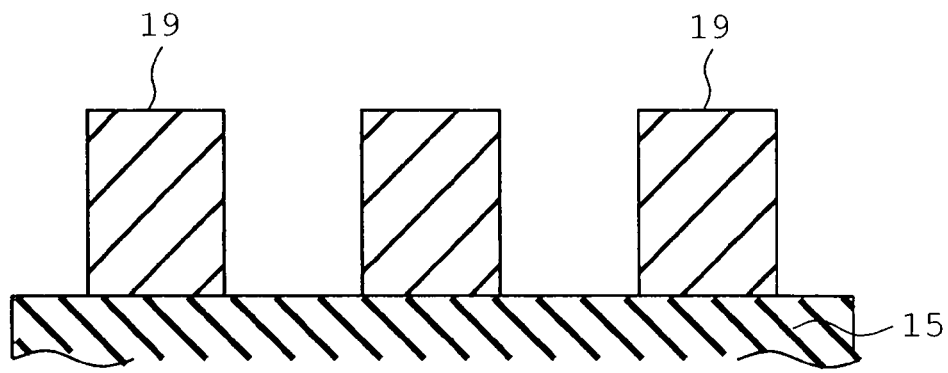
Figure 6:
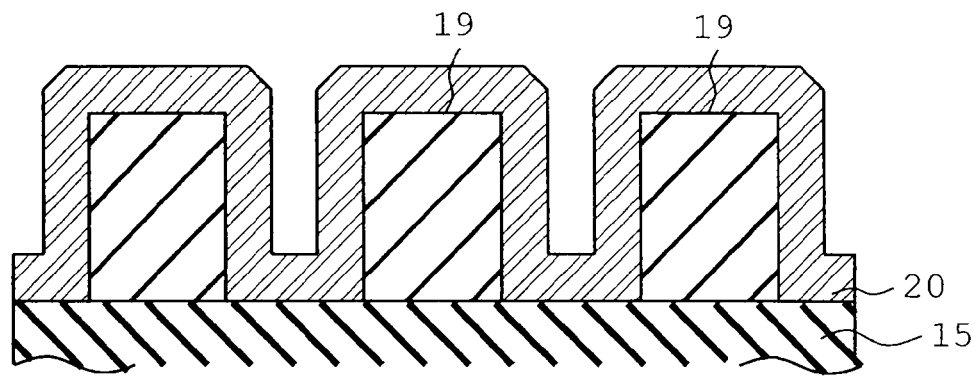
Figure 7:
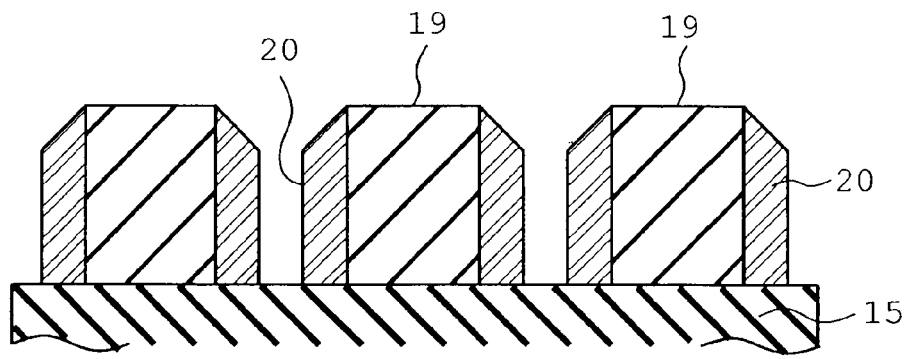

Subsequently, the BSG film 16 is processed by a reactive ion etching (RIE) process with the resist 17 serving as a mask. The processing is carried out until a surface of the silicon oxide film 15 is exposed. After the resist 17 has been removed, a BSG film 19 is obtained which is formed with a line-and-space pattern with the predetermined pitch as shown in FIG. 5. Subsequently, an amorphous silicon film 20 serving as a second film is deposited along a surface of the BSG film 19 and an upper surface of the silicon oxide film 15 as shown in FIG. 6. The amorphous silicon film 20 has a film thickness which is set so as to be substantially equal to one third of a line dimension of the line-and-space pattern of the resist 17. The amorphous silicon film 20 is then removed by the RIE process so that part thereof is left only on the sidewalls of the BSG film 19 as shown in FIG. 7. In this case, an inclined face is formed on an upper part of the amorphous silicon film 20 as the result of removal by the RIE process.

Figure 8:
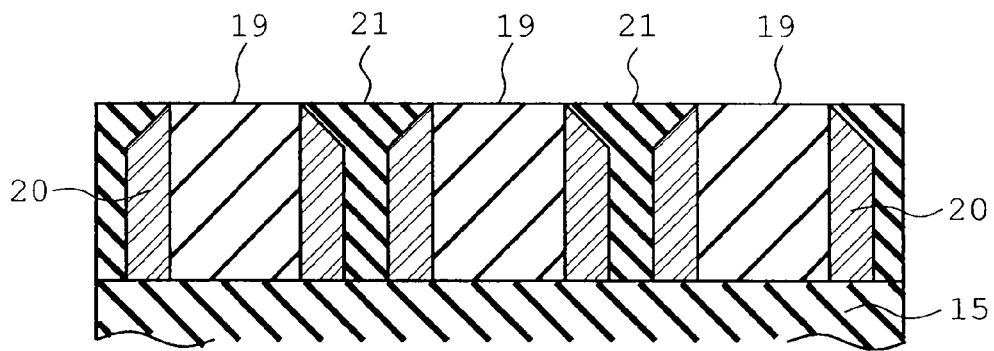
Figure 9:
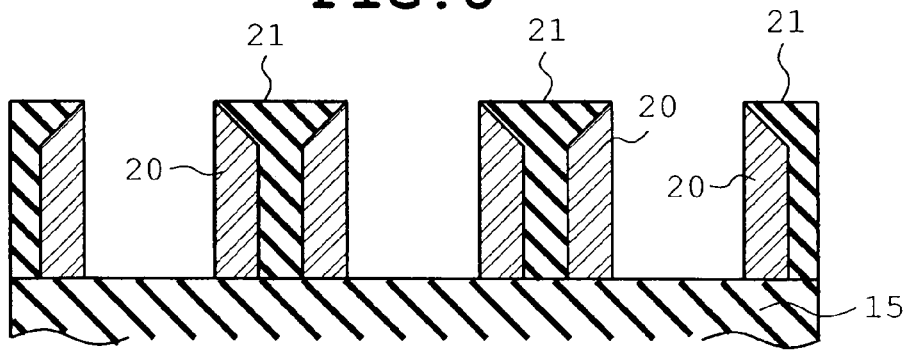

Subsequently, a silicon nitride film 21 serving as a third film is deposited while the aforesaid part of the amorphous silicon film 20 is left on the sidewalls of the BSG film 19, as shown in FIG. 8. Furthermore, the silicon nitride film 21 is then removed until the BSG film 19 is exposed. In this regard, the RIE process or a chemical mechanical polishing (CMP) process may be carried out for this purpose. The BSG film 19 is removed using a chemical after removal of the silicon nitride film 21 until exposure of the BSG film 19.

Figure 10:
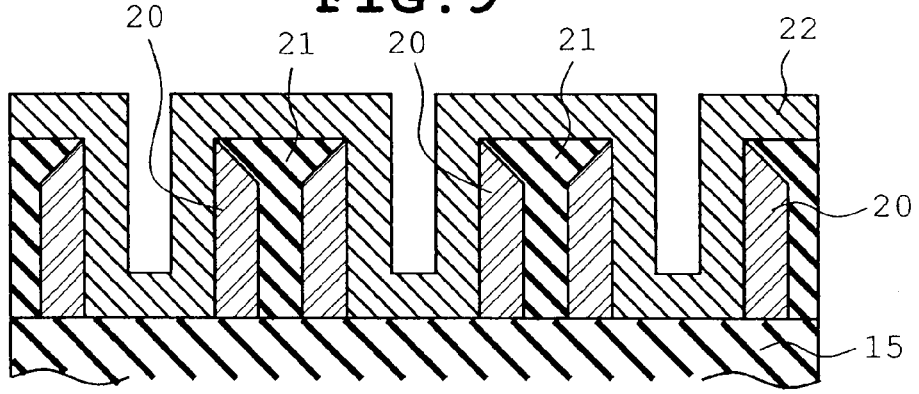
Figure 11:
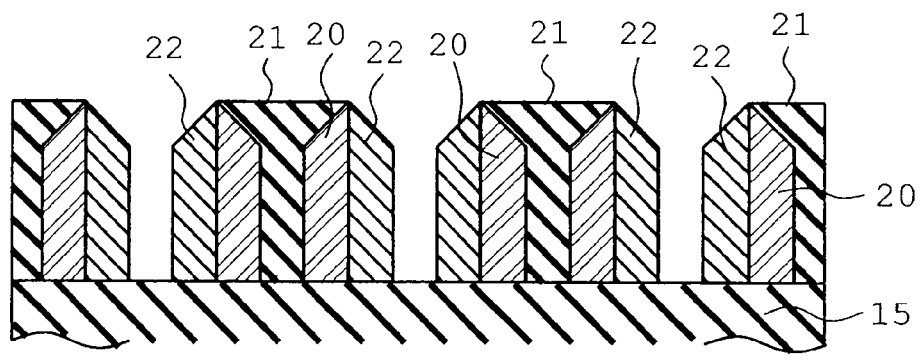

Subsequently, a BSG film 22 serving as a fourth film is deposited along a side surface of the exposed amorphous silicon film 20, the upper surfaces of the silicon oxide film 15 and silicon nitride film 21 as shown in FIG. 10. In this case, the BSG film 22 has a film thickness that is set so as to be substantially equal to one third of the line dimension of the line-and-space pattern of the resist 17. Thereafter, the BSG film 22 is removed by the RIE process until the silicon nitride film 21 serving as the third film is exposed, as shown in FIG. 11. In this case, inclined faces are formed on upper parts of the BSG film 22 as the result of removal by the RIE process.

Figure 4:
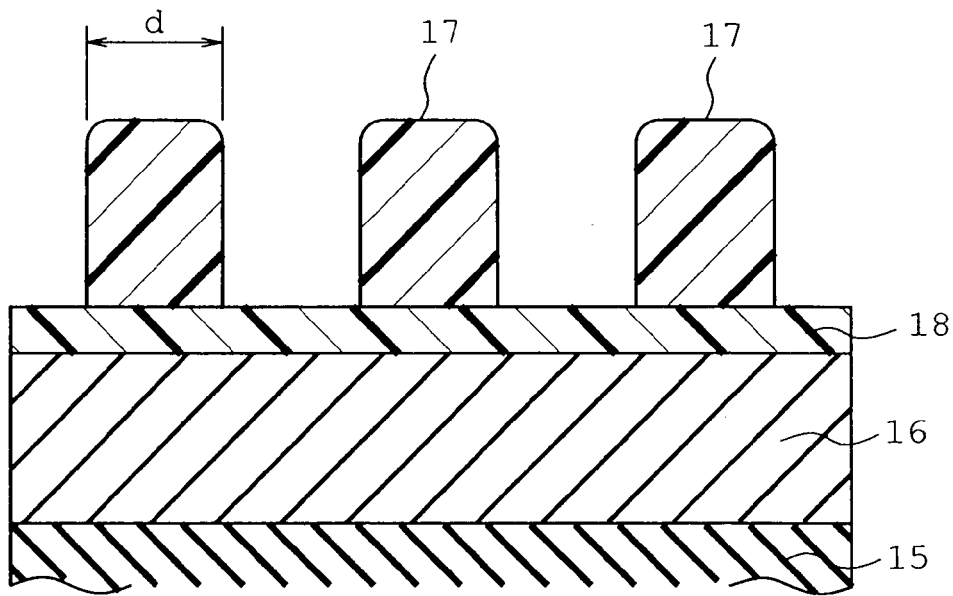
Figure 12:
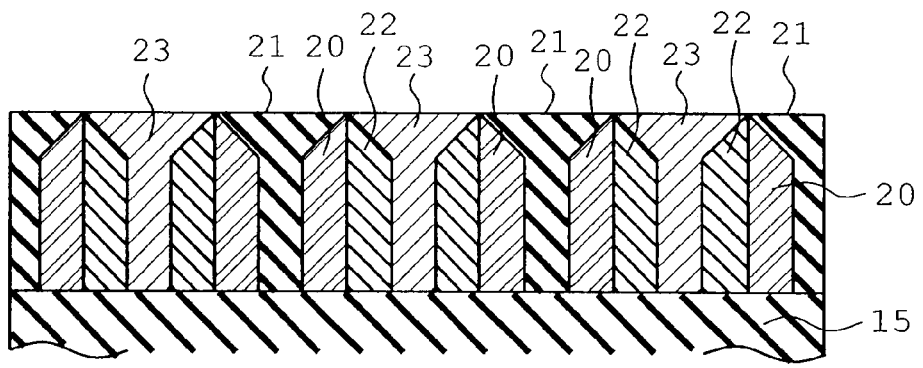
Figure 13:
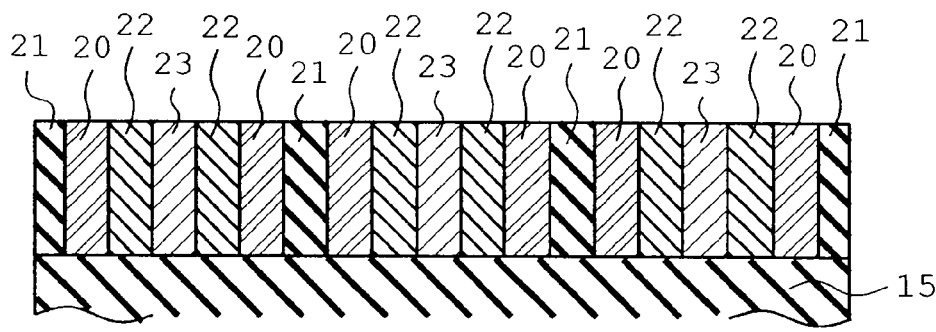
Figure 14:
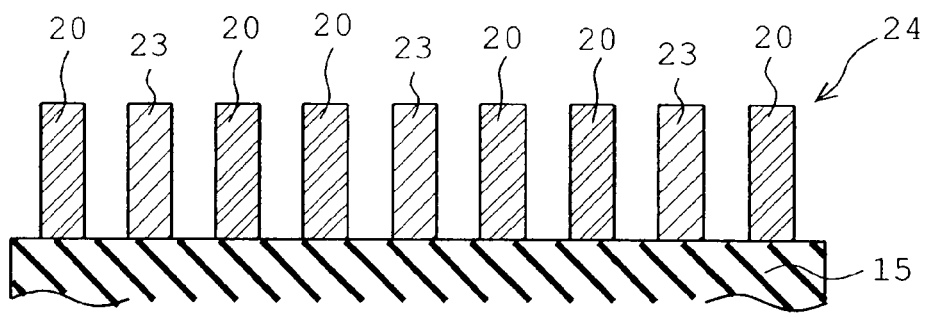

Subsequently, an amorphous silicon film 23 that is the same as the second film (the amorphous silicon film 20) is deposited on the silicon oxide film 15 as a fifth film, as shown in FIG. 12. The CMP process is carried out to remove the amorphous silicon films 20 and 23, the silicon nitride film 21 and the BSG film 22 as shown in FIG. 13. In this case, the CMP process is carried out until the upper inclined surfaces of the films 20 and 22 are removed. In this regard, the RIE process may be carried out, instead of the CMP process. Subsequently, the BSG film 22 serving as the fourth film and the silicon nitride film 21 serving as the third film are removed using respective chemicals as shown in FIG. 14. In the above-described configuration, a line-and-space pattern 24 comprises the amorphous silicon film (the second film) formed on the silicon oxide film 12 (a workpiece film) and the amorphous silicon film 23 (the fifth film). The line-and-space pattern 24 has a pitch which is one third of the pitch of the line-and-space pattern of the resist 17 (that is, the line-and-space pattern formed by the lithography technique) as shown in FIG. 4. Consequently, the above-described method can provide a line-and-space pattern having a fine pitch exceeding the resolution limit of the exposure technique. For example, when a line dimension d (space dimension) of the line-and-space pattern of the resist 17 is 0.3 µm long, a line dimension (space dimension) of 0.1 µm can be obtained concerning the line-and-space pattern 24.

Subsequently, the silicon oxide film 15 is processed by the RIE process while the line-and-space pattern comprising the amorphous silicon films 20 and 23 serves as a mask. The subsequent process is the same as the process of the known gate electrode and will not accordingly be described.

When the silicon oxide film 15 is etched by the RIE process under the condition where the amorphous silicon film 20 has an inclined face on only one upper part thereof, the dimensional precision of the etched silicon oxide film 15 is reduced and the conditions of the RIE process to maintain the dimensional precision becomes more strict. According to the foregoing embodiment, however, the amorphous silicon films 20 and 23, the silicon nitride film 21 and the BSG film 22 are etched until the inclined faces of the amorphous silicon film 20 are removed as shown in FIG. 13. Consequently, since each of the amorphous silicon films 21 and 23 is formed into a symmetric rectangular shape as shown in FIG. 14, the foregoing problem can be overcome.

The above-described fabricating method of the embodiment includes the step of depositing the desired silicon oxide film on the silicon substrate 1, depositing the BSG film 16 on the silicon oxide film 15 and forming the resist 17 on the BSG film 16. The method further includes the step of processing the BSG film 16 with the resist 17 serving as the mask, thereby removing the resist 17, the step of depositing the amorphous silicon film on the processed BSG film 19 and processing the amorphous silicon film 20 so that the amorphous silicon film is left only on the sidewalls of the BSG film 19, the step of depositing the silicon nitride film 21 on the silicon oxide film 15 while the amorphous silicon film is left only on the sidewalls of the BSG film 19, the step of removing the silicon nitride film 21 until the BSG film 19 is exposed, the step of removing the exposed BSG film 19, the step of depositing the BSG film 22 after removal of the BSG film 19, the step of depositing the amorphous silicon film 23 after the BSG film has been left on only the sidewalls of the amorphous silicon film 20, the step of removing the amorphous silicon film 20 and the BSG film 22 until the inclined faces of the amorphous silicon film 20 and the BSG film 22 are removed, and the step of removing the silicon nitride film 21 and the BSG film 22. Since the silicon oxide film 15 is processed with the amorphous silicon films 20 and 23 serving as the mask, the line-and-space pattern 24 comprising the amorphous silicon films 20 and 23 both formed on the silicon oxide film 15 has a pitch which is one third of the pitch of the line-and-space pattern of the resist 17 (that is, the line-and-space pattern formed by the lithography technique). Consequently, the method of the embodiment can provide a line-and-space pattern having a fine pitch exceeding the resolution limit of the exposure technique.

Figure 15:
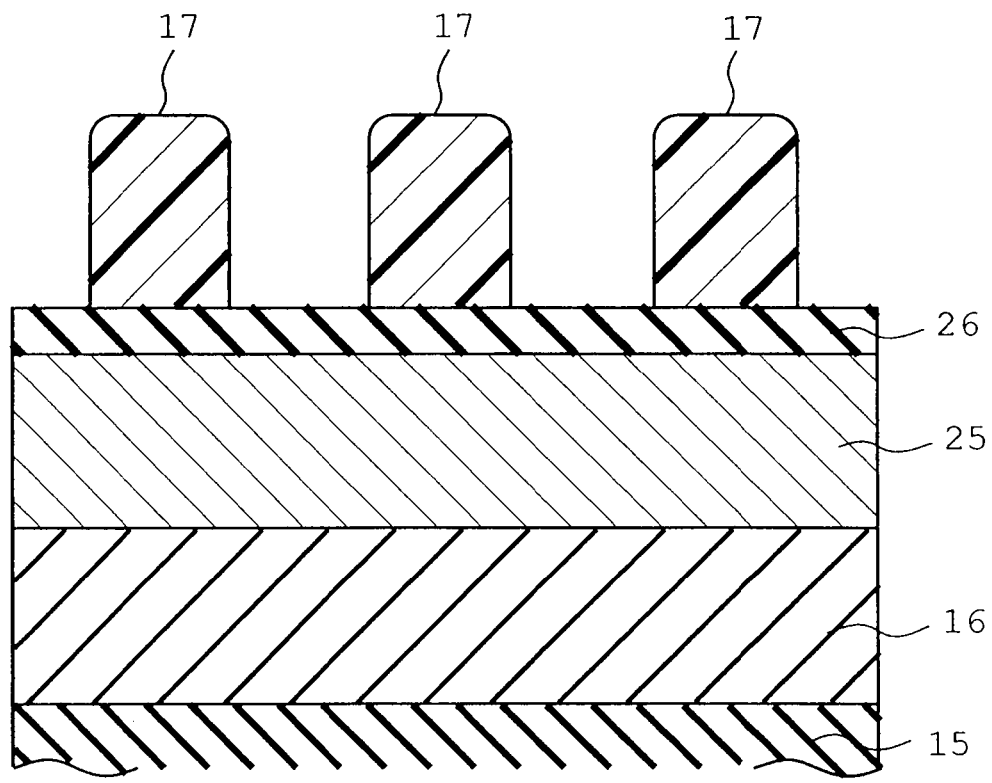
FIGS. 15 and 16 are schematic sectional views of the semiconductor device of a second embodiment at respective stages of fabricating process.
Figure 16:
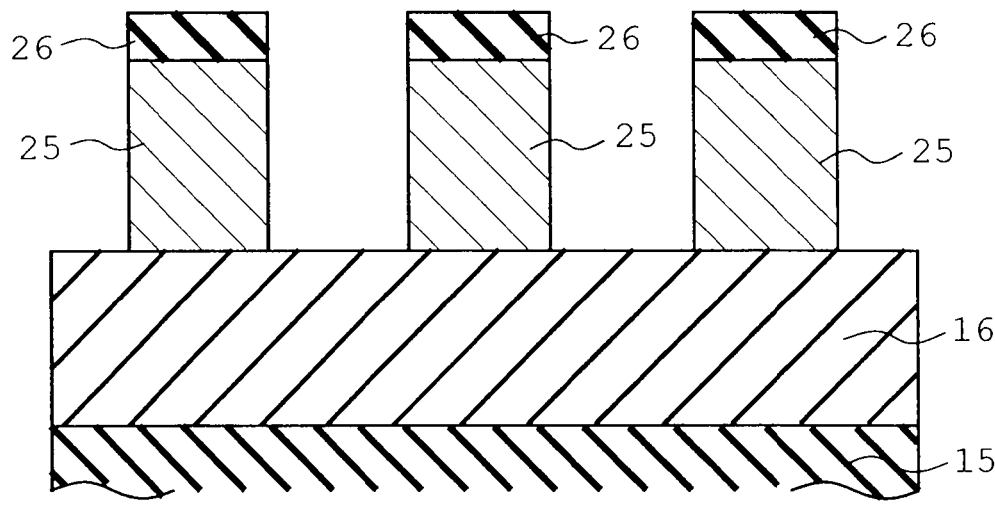

FIGS. 15 and 16 illustrate a second embodiment of the invention. The identical or similar parts in the second embodiment are labeled by the same reference symbols as those in the first embodiment. In the second embodiment, a transfer layer 25 for transferring a pattern is used when the BSG film 16 (the first film) is processed using the resist 17 of the line-and-space pattern. More specifically, the transfer layer 25 comprising a carbon system film is formed on the BSG film 16. The transfer layer 25 may be a coating film or a chemical vapor deposition (CVD) film. A spin-on-glass (SOG) film 26 is formed on the transfer layer 25. FIG. 16 shows the transfer layer 25 on which the resist 17 pattern has been transferred. Furthermore, the transfer layer 25 may be a Si-containing antireflection film (DARK) or a Si-containing carbon film. The other configuration of the memory cell region of the NAND flash memory is substantially the same as that of the first embodiment. Accordingly, the second embodiment can achieve the same effect as the first embodiment.

The invention should not be limited to the above-described embodiments. The embodiments may be modified or expanded as follows. In each embodiment, the first to fifth films are the BSG films 65, the amorphous silicon film 20, the silicon nitride film 21, the BSG film 22 and the amorphous silicon film 23 respectively. Other films may be used, instead. In this case, it is preferable that any one of the first to fifth films contains the silicon oxide film, the silicon nitride film or the Si film.

Furthermore, the second and fifth films may be constituted by the same film (the amorphous silicon film) in each embodiment. The second and fifth films may comprise different films if the each of the second and fifth films can be in an etching selective ratio to the workpiece film. Furthermore, although the invention is applied to the process of fabricating the gate electrode in each foregoing embodiment, the invention may be applied to a process of fabricating shallow trench isolations STI) or wiring pattern.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device, comprising:

depositing a desired workpiece film above a semiconductor substrate and further depositing a first film on the workpiece film so that a resist is formed above the first film, the resist being patterned into a line-and-space pattern with a predetermined pitch;

processing the first film with the resist serving as a mask, removing the resist and thereafter, depositing a second film along a surface of the processed first film, the second film having a film thickness that is one third of the predetermined pitch, and processing the second film so that upper surfaces of the first film and the workpiece are exposed and so that the second film is left on a sidewall of the first film;

depositing a third film on the exposed workpiece, the exposed first film and the second film;

planarizing the third film so that the upper surface of the first film is exposed;

removing the first film exposed by the planarizing process so that the sidewall of the second film is exposed;

depositing a fourth film along the sidewall of the exposed second film and an upper surface of the planarized third film, the fourth film having a film thickness that is one third of the predetermined pitch;

removing the fourth film formed on the upper surfaces of the planarized third film and the workpiece so that the upper surfaces of planarized third film and the workpiece are exposed and the fourth film is left on the sidewall of the second film;

depositing a fifth film on the exposed upper surfaces of the planarized third film and the workpiece and the fourth film;

planarizing the fifth, second, third and fourth films so that the upper surfaces of the second, third, fourth and fifth films are exposed;

removing the exposed third and fourth films; and processing the workpiece film while the second and fifth films left as the result of removal of the third and fourth films serve as a mask, wherein the workpiece film comprises a silicon oxide film, the third film comprises a silicon nitride film, the first and fourth films each comprise one and the same type of film having selectivity with the workpiece film and the third film, and the second and fifth films each comprise one and the same type of film having selectivity with the third and first films.

2. The method according to claim 1, wherein each of the first and fourth films is a boro-silicate glass film, and each of the second and fifth film is an amorphous silicon film.

3. The method of claim 1, further comprising forming a transfer layer which transfers a pattern between the first film and the resist.

4. The method according to claim 1, wherein a gate oxide film, a first polycrystalline silicon film, an intergate insulating film, a second polycrystalline silicon film, and a silicon nitride film are sequentially formed on the semiconductor substrate, and the workpiece film is formed on the silicon nitride film.

5. The method according to claim 1, wherein:

an inclined face is formed on an upper part of the second film in the leaving the second film only on the sidewall of the first film;

an inclined face is formed on an upper part of the fourth film in the removing the fourth film on the sidewall of the second film; and in the exposing the upper surfaces of the second, third, fourth and fifth films, planarization is carried out until the inclined faces of the second and fourth films are removed.

6. A method of fabricating a semiconductor device, comprising:

depositing a desired workpiece film above a semiconductor substrate and further depositing a first film on the workpiece film so that a resist is formed above the first film, the resist being patterned into a line-and-space pattern with a predetermined pitch;

processing the first film with the resist serving as a mask, removing the resist and thereafter depositing a second film along a surface of the processed first film, the second film having a film thickness that is one third of the predetermined pitch, and processing the second film so that upper surfaces of the first film and the workpiece are exposed and so that the second film is left on a sidewall of the first film;

depositing a third film on the exposed workpiece, the exposed first film, and the second film;

planarizing the third film so that the upper surface of the first film is exposed;

removing the first film exposed by the planarizing process so that the sidewall of the second film is exposed;

depositing a fourth film along the sidewall of the exposed second film and an upper surface of the planarized third film, the fourth film having a film thickness that is one third of the predetermined pitch;

removing the fourth film formed on the upper surfaces of the planarized third film and the workpiece so that the upper surfaces of planarized third film and the workpiece are exposed and the fourth film is left on the sidewall of the second film;

depositing a fifth film on the exposed upper surfaces of the planarized third film and the workpiece and the fourth film;

planarizing the fifth, second, third, and fourth films so that the upper surfaces of the second, third, fourth, and fifth films are exposed;

removing the exposed third and fourth films; and processing the workpiece film while the second and fifth films left as the result of removal of the third and fourth films serve as a mask, wherein:

an inclined face is formed on an upper part of the second film in the leaving the second film only on the sidewall of the first film;

an inclined face is formed on an upper part of the fourth film in the removing the fourth film on the sidewall of the second film; and in the exposing the upper surfaces of the second, third, fourth and fifth films, planarization is carried out until the inclined faces of the second and fourth films are removed.

7. The method according to claim 6, further comprising forming a transfer layer which transfers a pattern between the first film and the resist.

8. The method according to claim 6, wherein a gate oxide film, a first polycrystalline silicon film, an intergate insulating film, a second polycrystalline silicon film, and a silicon nitride film are sequentially formed on the semiconductor substrate, and the workpiece film comprises a silicon oxide film formed on the silicon nitride film.

* * * * *